United States Patent [19]

Brault et al.

[11] 4,168,448

[45] Sep. 18, 1979

[54] SOLID-STATE COLOR IMAGING DEVICE HAVING AN INTEGRAL COLOR FILTER

[75] Inventors: Albert T. Brault; William A. Light; Thomas W. Martin, all of Rochester, N.Y.

[73] Assignee: Eastman Kodak Company, Rochester, N.Y.

[21] Appl. No.: 842,867

[22] Filed: Oct. 17, 1977

Related U.S. Application Data

[62] Division of Ser. No. 730,886, Oct. 8, 1976, Pat. No. 4,081,277.

[51] Int. Cl.² .................. H01J 29/36; H01J 31/38; H04N 9/07
[52] U.S. Cl. ........................................ 313/371; 358/43
[58] Field of Search ................................. 313/371

[56] References Cited

U.S. PATENT DOCUMENTS 3,535,775 10/1970 Garfinkel et al. ............... 29/584
3,971,065 7/1976 Bayer ................................ 358/41

Primary Examiner—Robert Segal
Attorney, Agent, or Firm—J. Jeffrey Hawley

[57] ABSTRACT

A method for making a color imaging device that comprises means for sensing radiation comprising a planar array of charge-handling semiconductive photosensors, at least some of the photosensors having a radiation sensing area with at least one dimension less than about 100 micrometers, and superimposed thereon, filter means for controlling access of radiation to the sensing means. The filter means comprises a transparent, polymeric dye receiving layer for receiving heat-transferable dyes and further comprises a plurality of radiation intercepting means defining a planar array of filter elements lying in the receiving layer in micro-registration with the sensing areas of the photosensors. The filter area of each intercepting means contains at least one heat-transferable dye transferred to the dye receiving layer by heating and diffusion. The heat-transferable dye absorbs radiation in at least one portion of the spectrum and transmits radiation in at least one other portion of the spectrum. The color imaging device comprises an interlaid pattern having at least two sets of dye intercepting means, the first set having a different radiation absorption and transmission characteristic from that of the second set. The heat-transferable dye is diffused into the dye receiving layer at an elevated temperature through window areas in a photoresist layer.

14 Claims, 11 Drawing Figures

AFTER COATING MORDANT LAYER

AFTER COATING RESIST

AFTER EXPOSURE

AFTER DEVELOPMENT

AFTER DYE IMBIBITION

AFTER STRIPPING RESIST

SOLID-STATE COLOR IMAGING DEVICE HAVING AN INTEGRAL COLOR FILTER

This is a division of application Ser. No. 730,886, filed Oct. 8, 1976, now U.S. Pat. No. 4,081,277, issued Mar. 28, 1978.

FIELD OF THE INVENTION

The invention relates to solid-state color imaging devices, particularly to a solid-state photosensitive device that has a planar array of charge-handling semiconductive photosensors in micro-registration with a multicolor planar array of filter elements and to methods for making them. The color imaging devices are particularly useful for solid-state video cameras.

DESCRIPTION RELATIVE TO THE PRIOR ART

A reliable yet sensitive all-solid-state camera would find abundant utility, including, for example, use in television, card readers, facsimile recorders, picturephones, and character recognition, etc. However, in addition to the problems of the bulk of non-solid-state cameras which are further prone to drift, misalignment and short tube life, color cameras suffer from the complications of having to register separate electron beams and to reduce the effects of electron beam lag. Thus, a relatively simple efficient color camera which overcomes these problems is still sought.

Color photosensitive devices using charge-handling solid-state image sensors of various types, for example, charge-coupling devices, known as CCDs, and charge-coupling imagers known as CCIs, have been proposed for and used in video cameras. To avoid optical complexity and problems with image registration, it is highly desirable that color image sensing occur at a single imaging site, e.g., at a single planar photosensitive array. Difficulty is encountered with such "single-site" color imaging, however, because at least three distinct types of color information must be extracted in order to represent a color image in video signal form.

One known approach to providing a "single-site" color sensing device uses a single image sensor of broad wavelength sensitivity and a cooperating filter disc which passes a series of color filters through the image beam in a repeating sequence. The filter interpositions are synchronized to image scanning a filter typically being interposed during an entire field scan. Devices operating in this manner are said to produce a "field sequential" color signal. One problem with this approach is that the resulting signal presents the extracted color image information in a time order which is radically different from the time order of, say, the standard NTSC video signal. (The standard NTSC video signal is described in Chapter 16, "Television Transmission", of Transmission Systems For Communications, Revised Third Edition, by Members of the Technical Staff of Bell Telephone Laboratories, Copyright 1964, Bell Telephone Laboratories, Inc.) A further disadvantage is that some of the color image information (e.g., blue image information if a blue basic color is utilized) tends to be disproportionately detailed and hence wasteful of sensor capacity in consideration of the response characteristics of the human eye.

Certain other proposed approaches to achieving "single-site" color image sensing call for the use of striped color filters superimposed on a single image sensor. One such type of image sensor uses filter grids which are angularly superimposed on one another (see U.S. Pat. No. 3,378,633). As a result of image scanning, such image sensors produce a composite signal wherein chrominance information is represented in the form of modulated carrier signals. Such apparatus may be adapted to produce signals in the NTSC format or, if desired, the color image information can be separated by frequency domain techniques. In practice, however, it has proven difficult to produce such sensors economically, particularly where detailed image information is required.

Striped filters which transmit a repeating sequence of three or more spectral bands have also been proposed for use in color imaging. With this arrangement, the filters are typically aligned in one direction and scanning of the image is performed orthogonally to that direction. In effect, elemental sample areas are defined along the filter stripes. With this arrangement, it will be appreciated, sampling for a given color is not uniform for both directions. Additionally, the sampling patterns which results tend to provide a disproportionate quantity of information regarding basic color vectors to which the dye has less resolving power, e.g., "blue" information relative to "green" information.

Another approach to color imaging which has been proposed is the "dot" scanning system, as discussed in U.S. Pat. No. 2,683,769 to Banning. That approach generally uses spectrally selective sensor elements which are arranged in triads (red, green and blue elements, respectively). However, in U.S. Pat. No. 2,755,334, also to Banning, a repeated arrangement of four element groupings (red-, green-, blue- and white-sensitive elements, respectively) is described. Such approaches to color imaging have not been of practical significance, in part because of the cost of fabricating the number of individual elements which are required to provide image information having adequate detail.

Many of the problems associated with the prior art discussed above are overcome by the approach taken in U.S. Pat. No. 3,971,065, issued July 20, 1976, in the name of B. E. Bayer. In the Bayer approach, color imaging is effected by a single imaging array composed of individual luminance and chrominance sensing elements that are distributed according to type (sensitivity) in repeating interlaid patterns, the luminance pattern exhibiting the highest frequency of occurrence—and therefore the highest frequency of image sampling—irrespective of direction across the array.

Preferably, to produce an element array according to the Bayer approach, a solid state sensor array of broad wavelength sensitivity is provided with a superposed filter array. Filters which are selectively transparent in the green region of the spectrum are preferably employed in producing luminance-type elements, and filters selectively transparent in the red and blue spectral regions, respectively, are preferably employed in producing chrominance-type elements. (The term "luminance" is herein used in a broad sense to refer to the color vector which is the major contributor of luminance information. The term "chrominance" refers to those color vectors other than the luminance color vectors which provide a basis for defining an image.)

Methods for providing a multicolor filter array are known in the art. For example, U.S. Pat. No. 3,839,039, issued Oct. 1, 1974 to Suzuku et al shows a multicolor filter which consists of a plurality of monocolor stripe filters laminated together, each monocolor stripe filter made by a process comprising exposing a substrate having a photosensitive surface to light through a striped mask, converting the light image into a metallic image, forming a dichroic layer uniformly on top of the metallic image and removing the dichoic layer together with the metallic layer. U.S. Pat. No. 3,771,857, issued Nov. 13, 1973 to Thomasson et al shows another multicolor striped filter which consists of a plurality of layers of striped monocolor filters formed successively on top of each other. U.S. Pat. No. 3,623,794, issued Nov. 30, 1971 to S. L. Brown and U.S. Pat. No. 3,619,041, issued Nov. 9, 1971 to D. W. Willoughby show multicolor filters consisting of a lamination of monocolor grating filters comprising photoresist grating patterns filled with dye-vehicle filter materials having preferential absorption in different regions of the visible spectrum.

As can be seen by the above-described patents, prior art multicolor filters comprise multiple layers of monocolor filter patterns stacked sequentially on top of each other in order to obtain multicolor filter arrays. However, it is desirable for each element in the filter array to be as close as possible to the surface of the underlying photosensor element or elements in the array. This result is most desirably accomplished by producing a relatively thin, single layer multicolor filter array superimposed on the surface of the image sensor. A single layer multicolor filter array substantially reduces the possibility that light rays which pass through a filter element at an angle to the optical axis will strike a photosensor element beneath an adjacent filter element. Further, higher resolution can be obtained by reducing the depth of focus requirements for the optics.

One method for providing such a single layer multicolor filter array is described in a copending U.S. patent application Ser. No. 730,885, filed on the same date herewith in the names of J. R. Horak, H. F. Langworthy, and F. Rauner, and entitled "Solid-State Color Imaging Devices and Method for Making Them". This application describes color imaging devices comprising a solid-state photosensitive device having a mordant layer coated thereon. Dyes are imbibed into the mordant layer in patterns using photoresist techniques to obtain a multicolor filter layer.

The present invention provides a method for making a single layer multicolor filter array using a heat-transfer process to diffuse dyes into a dye-receiving layer that is contiguous with a solid-state photosensitive device to produce the color imaging devices of this invention. Heat-transfer printing, as known, is a process for transferring dyestuffs to a receiving substrate by heating and diffusion from printed intermediate or auxiliary carriers, primarily paper webs. This process is widely used for printing patterns on textile materials as described in, for example, U.S. Pat. Nos. 3,632,291; 3,707,346; 3,829,286; 3,940,246; and 3,969,071; Canadian Pat. Nos. 954,301 and 860,888; and German Pat. No. 2,500,316. Other uses of this process include making color prints of documents as described in, for example, U.S. Pat. Nos. 3,508,492 and 3,502,871; British Pat. Nos. 1,275,067; 1,278,325; 1,281,859; 1,154,162; and 1,381,225; and in Research Disclosure No. 14223 published February 1976.

None of these references suggest that the heat-transfer process would be useful for making color filter arrays that must be in micro-registration with an underlying solid-state photosensor in order to have a useful solid-state color imaging device. In fact one would expect that diffusion of dyes at elevated temperatures would not produce images that have sharp enough boundaries on the micrometer scale to be useful in making such solid-state color imaging devices.

SUMMARY OF THE INVENTION

The present invention provides a method for making a color imaging device having an integral planar color filter array and color imaging devices so made. A color imaging device in accord with this invention comprises means for sensing radiation comprising a planar array of charge-handling semiconductive photosensors, and superposed thereon, filter means for controlling access of radiation to the sensing means. The filter means comprises a transparent, polymeric dye receiving layer for receiving a heat-transferable dye and a plurality of radiation intercepting means defining a planar array of filter elements lying in the dye receiving layer, the filter elements being in micro-registration with the sensing area or areas of the photosensors. The filter area of each intercepting means contains at least one heat-transferable dye transferred to the receiving layer by vaporization and diffusion. The heat-transferable dye absorbs radiation in at least one portion of the spectrum and transmits radiation in at least one other portion of the spectrum. Preferred color imaging devices of this invention comprise photosensors having at least one dimension that is less than about 100 micrometers, and more preferably the photosensors having a radiation sensing area less than about $10^{-4}$ square centimeters.

The filter means can be made by providing a transparent polymeric dye receiving layer on the sensing means and then heat-transferring dyes to form the filter elements or by forming the filter elements in a film comprising a heat-transfer dye receiving layer, the film then being laminated to the sensing means.

According to the invention, a plurality of radiation intercepting means defining an array of filter elements is formed in the heat-transfer dye receiving layer by:

A. coating over the dye receiving layer a layer of photoresist that is impermeable to the heat-transferable dye being used;

B. exposing the photoresist to a pattern representing a set of filter elements and developing the photoresist to obtain window areas in the photoresist layer corresponding to said pattern;

C. heating and diffusing heat-transferable dye through the window areas into the dye receiving layer; and D. removing the remaining portions of the photoresist to yield a first set of dyed filter elements in a planar array in the dye receiving layer.

Desirably steps (A) through (D) are repeated at least once to form another set of dyed filter elements in the heat-transfer dye receiving layer in an interalid pattern with the first set, each repetition of the steps yielding an additional set of dyed filter elements in an interlaid pattern with the prior sets, one set having a common light absorption and transmission characteristic which differs from another set.

The method for making the filter elements of the filter means as described above can provide filter elements having sharp image boundaries on the micrometer scale so that the filter elements can be superimposed on solid-state photosensors in microregistration with the edged of the photosensors. Micro-registration of the filter elements and the photosensors is important in obtaining good color reproduction.

Color imaging devices of this invention have an interlaid pattern of filter elements made of at least two sets of intercepting means, one set having a common radiation absorption and transmission characteristic different from the other set. Thus, the photosensors lying immediately beneath one set of intercepting means will respond to radiation from the same region of the spectrum and photosensors lying beneath the filter elements of other sets of intercepting means will respond to light from different regions of the spectrum.

The color imaging devices of the present invention are formed by superimposing the filter means on the sensing means so that the filter elements of the filter means are in micro-registration with the underlying photosensors of the sensing means. Generally, it is desirable to have the filter means contiguous with the sensing means; however, in certain embodiments where the filter means are formed on a thin transparent layer of film base (for example, as a substrate), the filter means can be separated from the sensing means by the thin film layer when it is superimposed on the sensing means (in other words, the thin film support layer can be considered an integral part of the filter means in such embodiments). Even so, for these embodiments, it is preferred to superimpose the filter means on the sensing means with the filter means closest to the sensing means and the transparent substrate on the other side of the sandwich.

DETAILED DESCRIPTION OF THE INVENTION

Figures 1A, 1B:
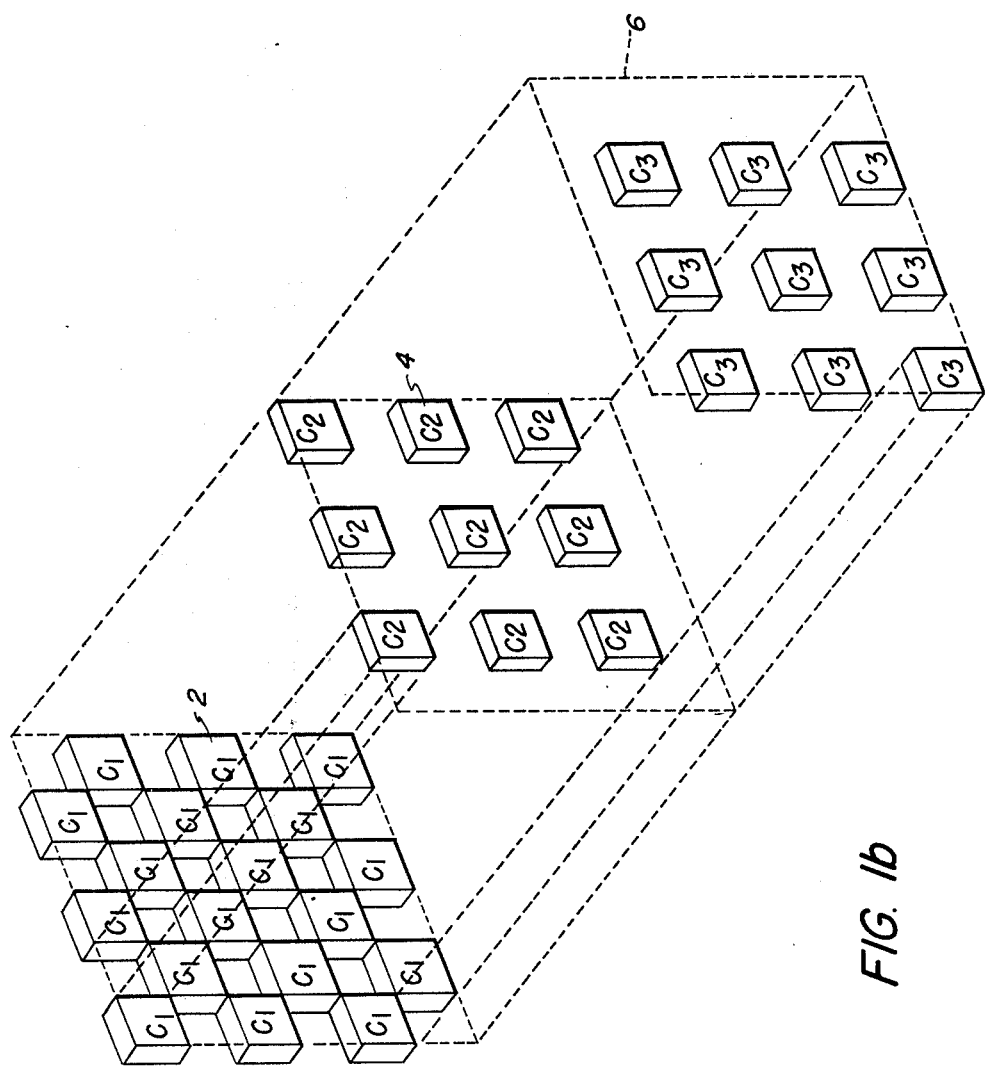
FIG. 1A is a pictorial representation of a multicolor filter array formed in accord with a preferred embodiment of the invention.
FIG. 1B is an exploded pictorial representation corresponding to the array depicted to FIG. 1A.

In accordance with the present invention, a color imaging device is provided which has filter means comprising a plurality of radiation intercepting means defining a planar array of filter elements superimposed on an array of solid-state photosensors. The solid-state photosensors useful in this invention are charge-handling image sensors, examples of which include, for instance, charge-coupled devices (also known as charge-coupled imagers, charge-transfer devices, charge-transfer imagers, etc.), charge injection devices, bucket brigade devices, diode arrays, combinations of these, and the like. The filter elements are in micro-registration with the radiation sensing area of the underlying photosensor or photosensors. As used herein the term "micro-registration" means that the defined areas have at least one dimension less than about 100 micrometers, for example, the filter areas and sensing areas described herein, are aligned so that, on a micrometer scale, the filter area and underlying sensing area or areas are substantially coextensive with each other and the boundaries of such areas are substantially superimposed. Thus a single filter element having at least one dimension less than about 100 micrometers may be superimposed over one sensing area or a group of sensing areas in accord with the particular embodiment of the invention.

The filter means comprises sets of dyed filter elements each set having common light absorption and transmission characteristics made by diffusing a heat-transferable dye into a transparent polymeric dye receiving layer. The filter means comprises at least two different sets of light intercepting means. Advantageously, the filter elements of each set of light intercepting means contain a heat-transfer dye or dyes having radiation absorption and transmission in a different region of the spectrum from that of each other set.

The filter elements of the color imaging devices of the present invention have very sharp edges. Therefore, the dyes in two adjacent filter elements have little or no overlap. This allows maximum transmission of light having the desired wavelength to the sensing area or areas of the photosensors lying in micro-registration beneath the filter elements. The sharpness of the edge or boundary of a filter element is determined by comparing the dimensions of the dyed area with the desired dimensions. If the dyed area, for example, extends 10 micrometers beyond the desired boundary, then the edge sharpness of the area would be 10 micrometers.

The importance of edge sharpness for the filter elements or the ability to make arrays of filter elements with the respective dyed areas being confined to desired dimensions is readily apparent when one considers the very small size of the sensing areas of the photosensors in a useful color imaging device and thus the correspondingly small size of the superposed filter elements. It has been suggested by one reference that a color imaging device will consist of an array of over 10,000 photosensors in an area $3 \times 5$ mm$^2$ (see "Charge-Coupling Improves its Image, Challenging Video Camera Tubes" by Tompsett et al at pages 166–167 of *Electronics*, Jan. 18, 1973, pages 162–169). Useful color imaging devices of this invention will comprise photosensors having sensing areas with at least one dimension that is less than about 100 micrometers, preferably having sensing areas of a size less than about $10^{-4}$ square centimeters, and even more preferably having sensing areas less than about $2.5 \times 10^{-5}$ square centimeters. In an especially preferred embodiment each sensing area will be rectangular in shape and have dimensions of 30 by 40 micrometers. Sensing areas in this preferred embodiment are separated by guard bands approximately 4 micrometers or less in width. Thus sharp edge definition of filter elements and micro-registration of each filter element with the underlying photosensor or photosensors are important. Therefore, in preferred embodiments of this invention, color imaging devices comprise filter elements having an edge sharpness less than about 4 micrometers and preferably less than about 2 micrometers. In some embodiments of this invention it may be desirable that the dyed areas of adjacent filter elements overlap by up to about 4 micrometers, i.e., approximately the size of the guard bands between adjacent sensing areas.

An example of a three-color filter 8 having a planar array of filter elements is illustrated in FIGS. 1A and 1B. Three sets of filter elements 2, 4 and 6 form an interlaid pattern to provide the three-color filter array 8. Each set of filter elements 2, 4 and 6 has a common light absorption and transmission characteristic which is different from each other set. In a preferred color imaging device of the invention, the filter 8 is superposed on an array of photosensors so that each individual filter element C is in micro-registration with an individual photosensor. As a result of this arrangement, an image can be sampled for all three color vectors by selecting appropriate dyes for use in the three sets of color patterns 2, 4 and 6 of the filter 8.

Figures 2A, 2B:
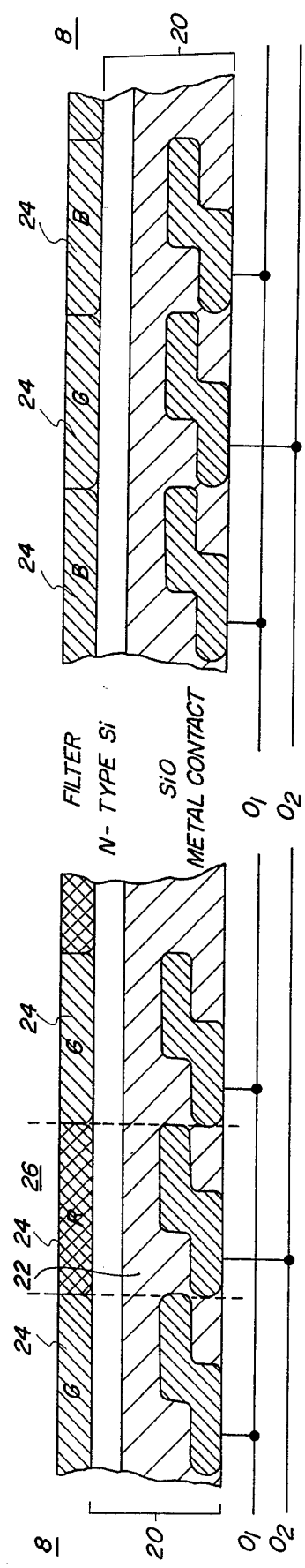
FIG. 2A is a cross-sectional representation, in part, of a row of sensing elements of a color imaging device having a planar filter array formed in accordance with the present invention.
FIG. 2B is a cross-sectional representation, in part, of a row of sensing elements adjacent the row represented in FIG. 2A.

As illustrated by FIGS. 2A and 2B, a preferred color imaging device of the present invention employs a solid-state imaging array 20 comprised of individual charge-coupled photosensors (e.g., photosensor 22 extending between the dashed lines of FIG. 2A). A filter 8, wherein the $C_1$, $C_2$ and $C_3$ of FIG. 1A and 1B are now G, R and B, respectively, is superposed on the imaging array 20. The filter 8 includes individual filter elements 24 which are aligned in one-to-one micro-registration with individual photosensors (e.g., photosensor 22) of the imaging array 20 to form a color imaging device of the invention. Individual filter elements 24 of the filter 8 are of the selectively transmitting type and are arranged in patterns as described above with reference to FIGS. 1A and 1B. The letters G, R and B on individual filter areas 24 serve to indicate selective green, red and blue, light transmission characteristics, respectively, of the individual filter elements, as would be employed in accordance with the presently preferred embodiment of a color imaging device of the invention. A preferred color imaging device of the invention comprises an array of color imaging elements 26, each comprising an individual filter element 24 combined with an individual photosensor such as photosensor 22, the combination being selectively sensitive to a particular region of the spectrum.

The filter 8 comprises a transparent polymeric heat-transfer dye receiving layer into which vaporized heat-transferable dyes are diffused to form patterns 2, 4 and 6 of individual filter areas 24. The dye receiving layer can comprise any conventional polymer capable of accepting heat-transferable dyes. Such polymers can be selected, for example, from the many synthetic polymers useful as substrates for the heat transfer of dyes to textiles in the textile industry as described in, for example, U.S. Pat. Nos. 3,632,291; 3,707,346; 3,829,286; and 3,940,246.

Particularly useful polymers of the heat-transfer dye receiving layer in accord with this invention can be selected from a class of amorphous, solvent soluble, aromatic polyesters comprising recurring units derived from the condensation residue of diol and carbonic acid or dicarboxylic acid, at least 30 mole percent of the recurring units containing a saturated gem-bivalent radical having a saturated polycyclic three-dimensional structure that includes a saturated bicyclic atomic bridge hydrogen ring member. When these polyesters are used to make color imaging devices of this invention, the filter elements can be made having extremely sharp image areas with edge sharpness of 4 micrometers or less. Examples of such polyesters and their preparation are described in U.S. Pat. No. 3,317,466, issued May 2, 1967 to Caldwell et al, the disclosure of which is hereby incorporated by reference. Particularly useful polyesters of this class are those having a $T_g$ of at least about 200° C.

Particularly useful polyesters representative of this class include, for example, poly[4,4'-isopropylidenediphenylene-co-4,4'-hexahydro-4,7-methanoindan-5-ylidenediphenylene (50:50 molar ratio) terephthalate-co-isophthalate (50:50 molar ratio)] and poly(4,4'-hexahydro-4,7-methanoindan-5-ylidenediphenylene terephthalate), poly[4,4'-(2-norbornylidene)-diphenylene carbonate], and poly(4,4'-hexahydro-4,7-methanoindan-5-ylidenediphenylene carbonate).

Various classes of dyes including, for example, azo, anthraquinone, indophenol, indoaniline, perinone, quinophthalone, acridine, xanthone, diazine, and oxazine dyes can be diffused into the dye receiving layers described above. A partial list of such dyes useful for making color imaging devices of the present invention include, for example,

| | |
|---|---|
| Eastman Fast Yellow 8GLF | Eastone Red R |
| Eastman Brilliant Red FFBL | Eastone Yellow 6GN |
| Eastman Blue GBN | Eastone Orange 2R |
| Eastman Polyester Orange 2RL | Eastone Orange 3R |
| Eastman Polyester Yellow GLW | Eastone Orange GRN |
| Eastman Polyester Dark Orange RL | Eastman Red 901 |
| Eastman Polyester Pink RL | Eastman Polyester Blue 4RL |
| Eastman Polyester Yellow 5GLS | Eastman Polyester Red B-LSW |
| Eastman Polyester Red 2G | Eastman Turquoise 4G |
| Eastman Polyester Blue GP | Eastman Polyester Blue BN-LSW |
| Eastman Polyester Blue RL | |
| Eastone Yellow R-GFD | (all available from the Eastman |
| Eastone Red B | Kodak Co., Rochester, N.Y.). |

Figure 4A:
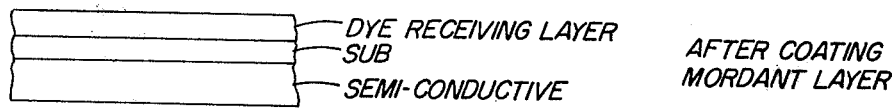
FIGS. 4A through 4F depict a sequence of steps in a preferred implementation for forming one color pattern in the filter array in accord with the invention.

The filter 8 is made by diffusing heat-transferable dyes into a dye receiving layer in desired patterns. In a preferred embodiment, the filter is formed by coating a dye receiving layer on a semiconductive photosensor substrate as illustrated by FIG. 4A. Generally, it is desirable to pacify a semiconductive substrate by applying a layer of silicon dioxide prior to coating. It may also be desirable to apply a layer of sub prior to coating the dye receiving layer in order to promote adhesion of the receiving layer to the substrate.

In forming the dye receiving layer on a semiconductive wafer, it has been found desirable to cure the coated wafer at elevated temperatures for a period of time sufficient to remove substantially all of the solvent used in the coating. The particular temperature and length of time should be selected based on the materials used. For example, curing at 200° C. for 2 hours has been found satisfactory when using poly(4,4'-hexahydro-4,7-methanoindan-5-ylidenediphenylene terephthalate) as the dye receiving layer. If the coating is not cured properly, the photoresist layer used in succeeding steps may not be effective.

Figure 4B:
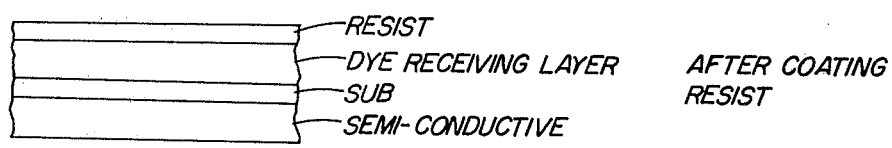

After the dye receiving layer is cured, a layer of photoresist is coated over the dye receiving layer as illustrated in FIG. 4B. The function of the resist is to prevent dye from diffusing into the dye receiving layer in areas protected by the resist. Thus the photoresist layer must be a barrier to the diffusion of dye, at least under the conditions of transfer. Gelatin based photoresists have been found satisfactory for this purpose. An example of a useful such resist is KOPR-TOP photoresist available from Chemco Photoproducts, Inc.

Figure 4C:
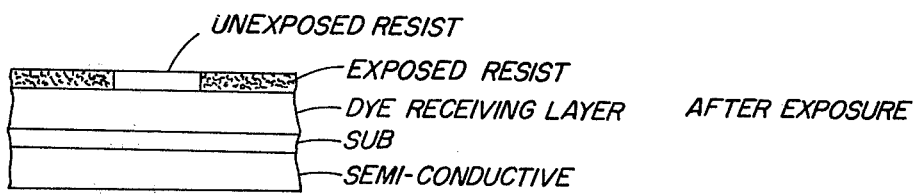
Figure 4D:
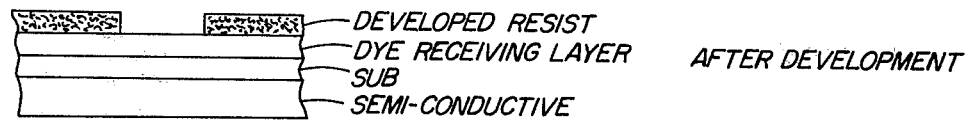

The resist layer is exposed (FIG. 4C) using a mask representing a desired dye pattern, for example, pattern 2 of FIG. 1A. The resist layer is then developed leaving window areas in the resist in the desired pattern (FIG. 4D).

Figure 4E:
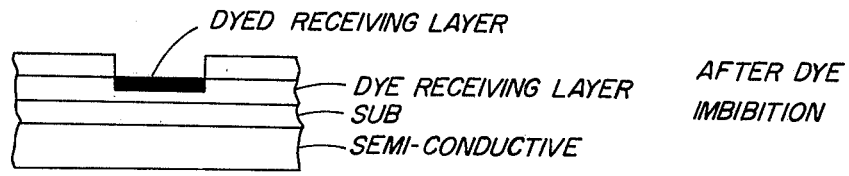

Next heat-transferable dye is heated and diffused into the dye receiving layer through the window areas provided in the resist (FIG. 4E). One method for accomplishing this transfer is to first coat a solution of the heat-transferable dye on an intermediate or carrier substrate. Usually a paper substrate is conveniently used although other suitable materials such as those generally used in art of heat-transfer printing can also be used. The carrier paper is then placed with its dye coated side in contact with the developed resist layer. The temperature is then raised to the transfer temperature, a temperature at which the dye has sufficient vapor pressure so that dye vapors can diffuse into the dye receiving layer at a practical rate. Generally, if the desired amount of dye can be transferred into the receiving layer in from about 5 to about 120 seconds, and preferably in about 20 to about 60 seconds, the rate of transfer is satisfactory. Considerably slower rates of transfer, however, will still be satisfactory as long as the length of time required for production can be tolerated.

It is contemplated that this invention can also be carried out by mixing a dye with a thermal solvent (or solid solvent). Thermal solvents are any materials that are solid at room temperature but are capable of being molten at elevated temperatures and capable of dissolving the dye mixed therewith. This mixture of a dye and thermal solvent, which melts and dissolves the dye, allows the dye to be heat transferred at a lower temperature than when using the dye without the thermal solvent. It is not known in this case whether the dye transfers as a liquid or a vapor.

Examples of thermal solvents useful for practicing this invention include, but are not limited to, aromatic hydrocarbons such as naphthalene and its derivatives, diphenyl and its derivatives, stilbene, durene and phenanthrene; phenols such as 2,3-dimethylphenol, 2,5-dimethylphenol, 3,4-dimethylphenol, 3,5-dimethylphenol, 2,4,6-trimethylphenol, 2,4,5-trimethylphenol, 3,4,5-trimethylphenol, catechol, resorcine, homocatechol, pyrogallol, α-naphthol and β-naphthol; aromatic amines such as α-naphthylamine and triphenylamine, carboxylic acids such as o-toluic acid, m-toluic acid, malonic acid, glutaric acid, pimelic acid, azelaic acid and maleic acid; sulfonic acids such as benzene-sulfonic acid, p-toluene-sulfonic acid, naphthale-α-sulfonic acid and naphthalene-β-sulfonic acid; fatty acids such as beef tallow, stearic acid, and palmitic acid and metal salts of these fatty acids; anionic, cationic, non-ionic and amphoteric surfactants; sugars such as fructose; and polyethylene glycol and chlorinated paraffin. Particularly useful thermal solvents include, for example, acetamide, 1,1-decanediol, succinimide, suberic acid, acenaphthene, methylanisate, benzophenone, methylstearate, methoxynaphthalene, and biphenyl.

Figure 4F:
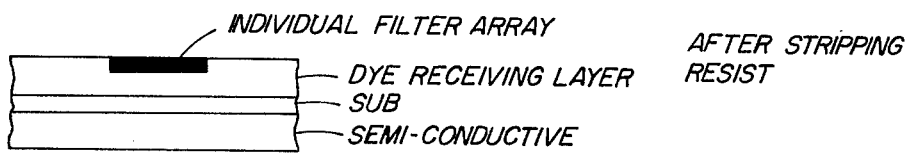

After the dye is transferred by diffusing into the receiving layer, the remaining resist is stripped from the receiving layer (as illustrated by FIG. 4F) leaving it with a pattern of dyed areas corresponding to the mask used for exposure. Additional patterns of dyed areas can be formed in the dye receiving layer by repeating the above steps using a fresh layer of photoresist, a different mask and a different dye. If the above-described process is performed three times, using a red, a blue, and a green dye, each transferred in a different pattern, a three-color filter 8 having an interlaid pattern of red, blue, and green dye containing areas is produced.

If the dye receiving layer is coated directly onto a charge-handling semiconductive device, the above sequence of steps for forming a multicolor filter array produces a color imaging device in accord with the present invention. If the dye receiving layer is in the form of film support or is coated on another substrate, the multicolor filter formed by the above sequence of steps must be superposed on an array of photosensors to produce a color imaging device in accord with this invention.

In a preferred embodiment of this invention, multicolor filters are made by vaporizing and diffusing heat-transferable dyes into the dye receiving layer at a temperature below the $T_g$ of the polymer comprising the dye receiving layer. Under these conditions extremely sharp edges for the dyed filter areas can be achieved.

Preferred color imaging devices of this invention are those having filters that selectively transmit green, red, and blue light to respective patterns of photosensors. These devices can be made by diffusing green, red, and blue dyes into a dye receiving layer in appropriate patterns according to the steps described above. Alternatively, these devices can be made using subtractive primary dyes—i.e., yellow, magenta, and cyan dyes. In any given filter element an appropriate combination of two of these dyes would be present to provide a green, red, or blue filter. The above-described procedure for making the color filter would then require that two dyes be diffused into the dye receiving layer to form a set of filter elements during each masking-exposure sequence. Alternatively, a single subtractive primary dye can be diffused into the dye receiving layer for two of the three sets of filter layer during each masking-exposure sequence. Two additional sequences would complete the three-color filter. Obviously various combinations of these procedures can be used depending upon the characteristics of the dyes which are being used.

Figure 3:
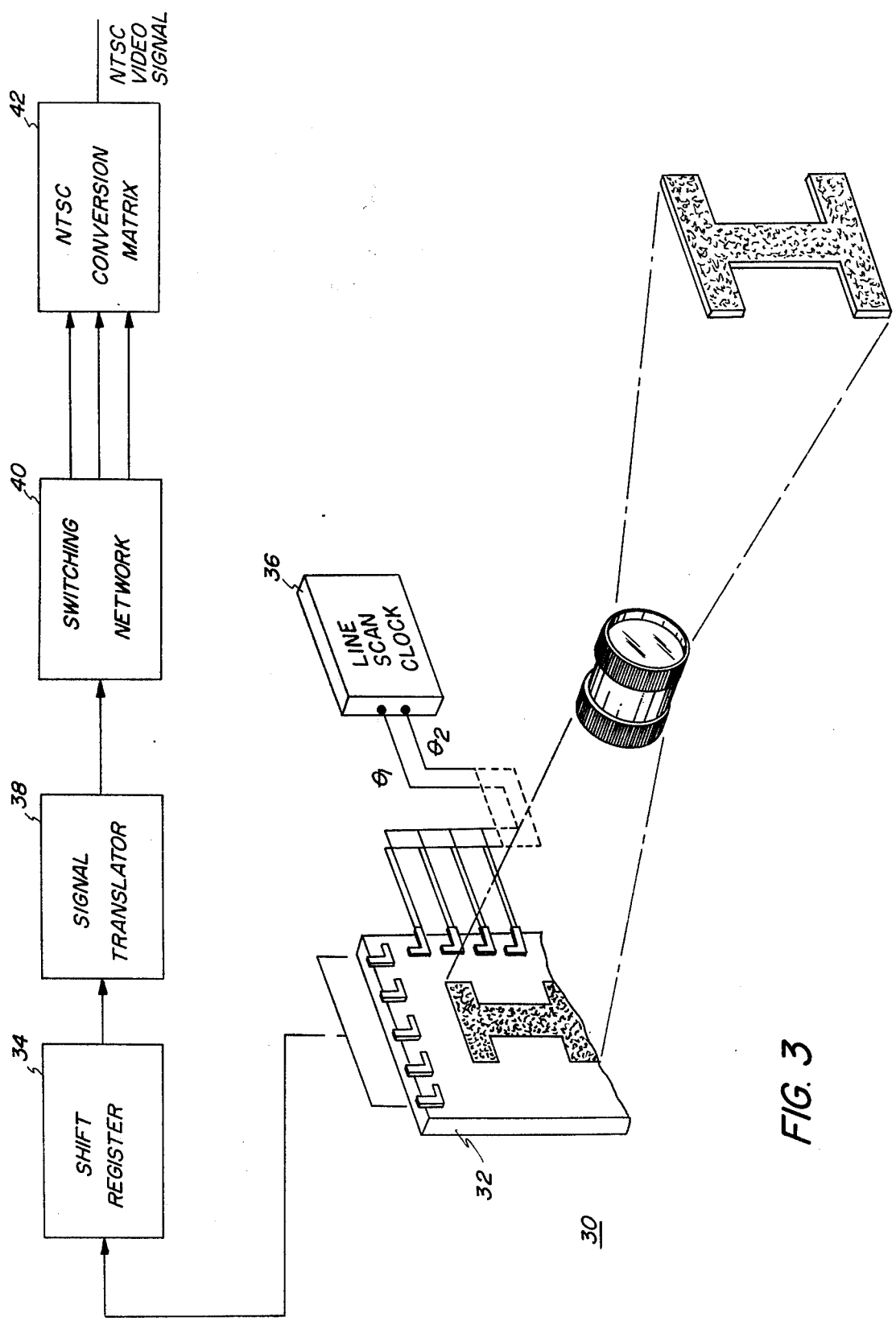
FIG. 3 is a perspective representation showing a basic arrangement of elements for a camera system using a color imaging device according to the invention.

Referring to FIG. 3, a color imaging device 30 according to the invention is shown in a simplified camera environment. Image information from individual rows of photosensors, such as a row 32, is transferred to a shift register 34 (generally formed "on board" the imaging chip) in response to signals from an interrogating apparatus such as a line scan clock 36. Such operation is well known, and apparatus for performing same is described in literature and patents regarding charge-handling devices such as CCD and CID arrays. It is also generally known to process the output signal of the register by means of a circuit 38. Using color imaging arrays according to the invention, however, information for the various base color vectors is interspersed as a result of the intermixed sensitivities of the color array elements. Accordingly, a switching network 40 is provided to separate the image signal sequence to a usable form, for example, to parallel green, red, and blue video signals.

In such form, the signals are conveniently converted to NTSC format using a conversion matrix 42. This is especially convenient if the number of rows in the array corresponds to the number of visible lines in a field scan (approximately 250) or the number of visible lines in a frame (approximately 500) comprised of interlaced fields.

The following examples are provided to further illustrate the invention.

EXAMPLE 1

Making a Color Filter With a Film as the Dye Receiving Layer 2 g of Eastman Brilliant Red FFBL (a dye available from the Eastman Kodak Co., Rochester, N.Y.) were dissolved in 100 ml of dichloromethane by stirring the dye in the solvent with a magnetic stirrer for 2 hours at room temperature. The resulting solution of dye in solvent was hand coated at about 150 micrometers wet thickness on Baryta paper. (Baryta paper is paper coated with a layer of BaSO$_4$ commonly used in the photographic arts. It was used in this example because it was convenient. Any other carrier would be satisfactory as long as it provides substantially uniform dyed areas, that is, it does not leave a pattern upon transfer. Typically useful carriers are those commonly used in art of heat-transfer printing.) The hand coating of dye was air dried overnight at room temperature.

Any conventional crosslinkable gelatin photoresist solution was used as a blocking layer. Suitable gelatin based photoresists are sold under the trademark Kopr-Top by Chemco Photoproducts Company. A crosslinkable gelatin photoresist was prepared by mixing 27.6 ml (27.6 g) of Kopr-Top Enamel with 3 ml (3.45 g) of Kopr-Top Sensitizer. A square of unsubbed poly(ethylene terephthalate) (Estar), about 5 cm. on a side, was spin-coated with the crosslinkable gelatin solution using a Headway Research spin-coater and coating at 2000 rpm for 50 seconds.

The gel-coated sample of Estar was exposed through a Qualitron neutral density mask for 4 min. using a 100 watt tungsten lamp placed about 1 foot from the sample. The exposed sample was developed by rinsing with water at room temperature for approximately 20 seconds to provide window areas through the photoresist through which dye is diffused. The developed sample was air dried by spinning on the spin-coater for 50 seconds. After drying, the gel-coated Estar was placed in contact with a 5 cm. square of the coating of Eastman Brilliant Red FFBL prepared above (coated side against coated side) and heated at 170° C. with the Baryta paper side against a heating block for 30 seconds. Upon heating the dye sublimed from the paper through the areas where the gelatin was dissolved away during development and into the Estar. An excellent quality dye reproduction of the Qualitron mask pattern was reproduced in the Estar.

The crosslinked gel areas on the Estar were removed by rinsing the sample with water and squeegeeing. The density of dyed areas of blue light was measured using a Macbeth TD-504 densitometer and found to be 1.6.

EXAMPLE 2

Example 1 was repeated using Eastman Blue GBN as the dye (also available from the Eastman Kodak Co.).

Density of dyed areas to red light was measured as 1.5.

EXAMPLE 3

Making a Three-Color Filter Array

A three color filter array was prepared using the techniques described in Example 1.

A 5 cm square sample of poly[4,4'-isopropylidenediphenylene-co-4,4;-hexahydro-4,7-methanoindan-5-ylidenediphenylene (50:50 molar ratio) terephthalate-co-isophthalate (50:50 molar ratio)] (called TIGG herein) film was spin-coated with crosslinkable gelatin, exposed, developed, and dried. Eastman Brilliant Red FFBL, coated on Baryta paper, as in Example 1, was transferred at 170° C. for 30 seconds. After dye transfer, the crosslinked gel areas on the TIGG were removed by rinsing with water and squeegeeing.

The sample was recoated with crosslinkable gelatin, exposed (using a different mask), developed and dried. Eastman Blue GBN coated on Baryta paper was transferred at 160° C. for 30 sec. After dye transfer, the crosslinked gel areas were again removed.

The TIGG was coated for a third time with crosslinkable gelatin, exposed (using a third mask), developer, and dried. A green dye made by dissolving 1 gram of Eastman Blue GBN and 1 gram of Eastman Fast Yellow 8GLF in 100 ml of dichloromethane and coated on Baryta paper was tranferred at 155° C. for 40 seconds. After dye transfer, the crosslinked gel was removed.

The resulting three color filter array was then viewed microscopically using transmitted light and a magnification of 50X. An excellent quality three color filter array was observed with image areas having dimensions of $30\mu$ to $40\mu$. Cross-sectional photomicrographs of the dyed image areas were made. The photomicrographs indicated that the thickness of the red areas was approximately $1.5\mu$, and that the thicknesses of the blue and green areas were approximately $1\mu$.

EXAMPLE 4

Making a Color Filter on a Quartz Disc

Three grams of poly(4,4'-hexahydro-4,7-methanoindan-5-ylidenediphenylene terephthalate), called T-GK, were dissolved in a mixture of 20 ml of dichloromethane and 35 ml of toluene by stirring the polymer in the solvent with a magnetic stirrer for four hours at room temperature. The resulting solution was spin-coated on a 25 mm diameter quartz disc coated with a subbing layer of poly(methylacrylate-co-vinylidene chloride-co-itaconic acid). The spin-coating was prepared using 1000 rpm for 50 seconds. The coating of T-GK polymer was dried in a laboratory oven for four hours at 120° C.

The dried disc was then spin-coated with crosslinkable gelatin as in Example 1. The gelatin was then exposed through a mask, developed, and dried as in Example 1. Eastman Brilliant Red FFBL coated on Baryta paper (as described in Example 1) was transferred at 175° C. for 40 seconds through the areas where the gelatin had washed away during development. After dye transfer the crosslinked gel areas were removed. An excellent quality dye reproduction of the Qualitron mask pattern used was reproduced in the T-GK. Examination of this color filter with an interference microscope indicated that the T-GK layer was approximately $0.5\mu$ thick. The density of dyed areas to blue light was measured using a Macbeth TD-504 densitometer and found to be 2.6.

EXAMPLE 5

Two grams of Eastman Polyester Blue BN-LSW were dissolved in 15 ml of dichloromethane by stirring the dye in the solvent with a magnetic stirrer for two hours at room temperature. A 2 inch×2 inch piece of copy paper was placed in the resulting dye solution and allowed to soak for approximately three minutes. The paper was removed from the dye solution and air dried for one hour.

A sample of T-GK film was spin-coated with crosslinkable gelatin using a Headway Research spin-coater and coating at 2000 rpm for 50 seconds. The gel-coated sample of T-GK was then exposed with a 100 watt tungsten lamp through a resolving power pattern. Exposure was made for four minutes with the lamp placed about 1 foot from the sample. The exposed sample was developed by rinsing with water at room temperature for approximately 20 seconds and dried by spinning on the spin-coater at room temperature for 50 seconds.

After drying, the gel-coated T-GK was placed in contact with the dye-coated paper prepared above (gel-coated side against the dye). The combination was heated (heating block in contact with paper side) at 220° C. for 30 seconds. The dye sublimed from the paper through the areas where the gelatin had dissolved away during development into the T-GK.

The crosslinked gel areas on the T-GK were removed by rinsing the sample with water and squeegeeing.

The resulting images produced in the T-GK were examined microscopically using transmitted light and a magnification of 50X. An excellent quality reproduction of the resolution test pattern was observed. The resolution was at least 90 lines/mm which was the maximum of the test target.

EXAMPLE 6

Making a Three-Color Filter on a Quartz Disc

A layer of T-GK polymer was coated on a 1 inch diameter quartz disc (or silicon wafer) in the same manner as described in Example 4 except the disc was first passivated with $SiO_2$. After coating the T-GK layer with a crosslinkable gelatin, exposing, and developing in the same manner as described in Example 1, the wafer was placed in contact with a carrier sheet containing the red dye, Eastman Red 901, (prepared similar to Example 1) and heated at 200° C. for 30 seconds. The remaining crosslinked gel was removed by washing for 30 minutes in a 3 M $CaCl_2$ solution at 80° C. accompanied by a gentle rubbing of the surface.

A second layer of crosslinkable gelatin was coated, exposed to a second mask, and developed. This time a carrier sheet containing the blue dye, Eastman Polyester Blue 4RL, was placed in contact with the disc and heated at 200° C. for 30 seconds. The remaining crosslinked gelatin was again removed.

Then a third layer of the gelatin resist was coated, exposed to a third mask, and developed. A carrier sheet containing a green dye, a mixture of Eastman Blue GBN and Eastone Yellow R-GFD, was placed in contact with the disc and heated at 180° C. for 30 seconds. The remaining resist was removed with $CaCl_2$ solution.

A quartz disc having an integral three-color filter of excellent quality comprising three patterns of filter areas with each filter area being 30 by 40 micrometers in size was produced.

The invention has been described in detail with particular reference to certain preferred embodiments thereof, but it will be understood that variations and modifications can be effected within the spirit and scope of the invention.

We claim:

1. In a color imaging device comprising a planar array of charge-handling semiconductive photosensors having sensing areas that are sensitive to radiant energy and where at least some of said photosensors have at least one dimension that is less than about 100 micrometers, and superimposed thereon, filter means comprising a plurality of radiation intercepting means defining a planar array of filter elements lying in micro-registration with the sensing areas of said photosensors; said filter means having at least two sets of intercepting means, one set having a common radiation absorption and transmission characteristic that is different from another set; the improvement wherein said filter means comprises a transparent, polymeric dye receiving layer in which said filter elements lie, the filter elements comprising at least one heat-transferable, heat diffused dye that absorbs radiation in at least one portion of the spectrum and transmits radiation in at least one other portion of the spectrum.

2. A color imaging device as described in claim 1 wherein said filter means comprises three sets of radiation intercepting means, the filter elements of all intercepting means of each set selectively transmitting light of a different primary color.

3. A color imaging device as described in claim 1 wherein at least some of said photosensors have a radiation sensing area less than about $10^{-4}$ square centimeters.

4. A color imaging device as described in claim 1 wherein each of said filter elements has at least one dimension that is less than about 100 micrometers.

5. A color imaging device comprising:
   A. means for sensing radiation comprising a planar array of charge-handling semiconductive photosensors, at least some of which have a radiation sensing area less than $10^{-4}$ square centimeters; and superimposed thereon,
   B. filter means for controlling access of radiation to said sensing means, said filter means comprising
      1. a transparent, polymeric dye receiving layer for receiving a heat-transferable dye and
      2. a plurality of radiation intercepting means defining a planar array of filter elements lying in said receiving layer in micro-registration with the sensing areas of said photosensors, the filter area of said intercepting means comprising at least one heat-transferable, heat-diffused dye that absorbs radiation in at least one portion of the spectrum and transmits radiation in at least one other portion of the spectrum,
   said filter means comprising three sets of said intercepting means, one set having filter elements that selectively transmit green light, a second set having filter elements that selectively transmit red light, and a third set having filter elements that selectively transmit blue light.

6. A color imaging device as described in claim 5 wherein each of said filter elements has at least one dimension that is less than about 100 micrometers.

7. A color imaging device as described in claim 5 wherein at least some of said photosensors have a radiation sensing area less than about $2.5 \times 10^{-5}$ square centimeters.

8. A color imaging device comprising:
   A. means for sensing radiation comprising a planar array of charge-handling semiconductive photosensors, at least some of which have a visible radiation sensing area less than $10^{-4}$ square centimeters; and superimposed thereon,
   B. filter means for controlling access of radiation to said sensing means, said filter means comprising
      1. a transparent, polymeric dye receiving layer for receiving a heat-transferable dye and
      2. a plurality of light intercepting means defining a planar array of filter elements lying in said receiving layer in micro-registration with the sensing areas of said photosensors, the filter area of said intercepting means comprising at least one heat-transferable, heat-diffused dye that absorbs radiation in at least one portion of the spectrum and transmits radiation in at least one other portion of the spectrum, 3. a first set of said light intercepting means having a common light absorption and transmission characteristic wherein light is absorbed in one portion of the visible spectrum and transmitted in another portion of the visible spectrum, and 4. a second set of light intercepting means having a common light absorption and transmission characteristic which differs from that of said first set of light intercepting means, said first and second set of light intercepting means forming an interlaid pattern.

9. A color imaging device as described in claim 8 wherein said first set of light intercepting means is superimposed over a greater total sensing area of said sensing means than said second set.

10. A color imaging device as described in claim 8 wherein said filter means comprises three sets of light intercepting means, the filter elements of all intercepting means of each set selectively transmitting light of a different primary color.

11. A color imaging device as described in claim 8 wherein at least some of said photosensors have a radiation sensing area less than about $2.5 \times 10^{-5}$ square centimeters.

12. A color imaging device comprising:

A. means for sensing radiation comprising a planar array of charge-handling semiconductive photosensors, at least some of which have a visible radiation sensing area less than $10^{-4}$ square centimeters; and superimposed thereon, B. filter means for controlling access of radiation to said sensing means, said filter means comprising 1. a transparent, polymeric dye receiving layer for receiving a heat-transferable dye and 2. a plurality of light intercepting means defining a planar array of filter elements lying in said receiving layer in micro-registration with the sensing areas of said photosensors, the filter area of said intercepting means comprising at least one heat-transferable, heat-diffused dye that absorbs radiation in at least one portion of the spectrum and transmits radiation in at least one other portion of the spectrum, 3. a first set of light intercepting means having a common light absorption and transmission characteristic wherein light is absorbed in one portion of the visible spectrum and transmitted in another portion of the visible spectrum, 4. a second set of light intercepting means having a common light absorption and transmission characteristic which differs from that of said first set of light intercepting means, 5. a third set of light intercepting means having a common light absorption and transmission characteristic which differs from that of both the first and the second set of light intercepting means, said first, second and third sets of light intercepting means forming an interlaid pattern.

13. A color imaging device as described in claim 12 wherein said first set of light intercepting means is superimposed over a greater total sensing area of said sensing means than either said second set or said third set.

14. A color imaging device as described in claim 12 wherein said first set of light intercepting means selectively transmits green light, said second set of light intercepting means selectively transmits red light, and said third set of light intercepting means selectively transmits blue light.

* * * * *